US006711389B2

(12) United States Patent
Medl et al.

(10) Patent No.: US 6,711,389 B2
(45) Date of Patent: Mar. 23, 2004

(54) POWER CONTROLLER FOR A MOBILE TERMINAL

(75) Inventors: Thomas E. Medl, Morrisville, NC (US); Ronald D. Boesch, Morrisville, NC (US)

(73) Assignee: Telefonaktiebolaget L.M. Ericsson (SE)

( * ) Notice: Subject to any disclaimer, the term of this patent is extended or adjusted under 35 U.S.C. 154(b) by 373 days.

(21) Appl. No.: 09/785,703

(22) Filed: Feb. 16, 2001

(65) Prior Publication Data

US 2002/0151284 A1 Oct. 17, 2002

(51) Int. Cl.[7] .............................................. H01Q 11/12
(52) U.S. Cl. ................. 455/127.2; 455/127.1; 455/522
(58) Field of Search ................. 455/522, 517, 455/125, 126, 127.2, 115.1, 81, 68, 69, 138, 127.1, 136, 245.1; 330/278, 279, 134, 129

(56) References Cited

U.S. PATENT DOCUMENTS

| | | | | |
|---|---|---|---|---|
| 5,148,382 A | * | 9/1992 | Kishi | 708/306 |
| 5,177,695 A | * | 1/1993 | Sung et al. | 700/297 |
| 5,337,006 A | * | 8/1994 | Miyazaki | 330/130 |
| 5,376,895 A | * | 12/1994 | Aihara | 330/129 |
| 5,434,537 A | * | 7/1995 | Kukkonen | 330/2 |
| 5,548,616 A | * | 8/1996 | Mucke et al. | 375/295 |
| 5,566,363 A | * | 10/1996 | Senda | 455/126 |
| 5,603,106 A | | 2/1997 | Toda | 455/126 |
| 5,697,074 A | * | 12/1997 | Makikallio et al. | 455/126 |
| 5,724,003 A | * | 3/1998 | Jensen et al. | 330/129 |
| 5,732,334 A | * | 3/1998 | Miyake | 455/126 |
| 5,737,697 A | | 4/1998 | Yamada | 455/126 |
| 5,752,172 A | | 5/1998 | Matero | 455/127 |
| 5,862,460 A | | 1/1999 | Rich | 455/116 |
| 6,154,664 A | | 11/2000 | Chorey et al. | 455/571 |
| 6,370,364 B1 | * | 4/2002 | Liimatainen | 455/126 |
| 6,519,293 B1 | * | 2/2003 | Miyake | 375/297 |

FOREIGN PATENT DOCUMENTS

| | | |
|---|---|---|
| EP | 1041727 | 10/2000 |
| WO | WO 9633555 | 10/1996 |

OTHER PUBLICATIONS

Nishikawa K et al: "An LS Based New Gradient Type Adaptive Algorithm Least Squares Gradient" IEICE Transactions on Fundamentals of Electronics, Communications and Computer Sciences, Institute of Electronics Information and Comm. Eng. Tokyo, JP, vol. E77–A, No. 9, Sep. 1, 1994, pp. 1417–1424, XP000477491 ISSN: 0916–8508.

* cited by examiner

Primary Examiner—Sonny Trinh
(74) Attorney, Agent, or Firm—Coats & Bennett, P.L.L.C.

(57) ABSTRACT

A power controller for a mobile terminal variable gain amplifier (VGA). A controller consistent with the invention controls VGA output using a feedback error signal established based on the difference between a signal representative of the VGA output and a signal representative of a target output. The error signal causes convergence of the VGA output to the target output based on a magnitude of the difference. A method of controlling the output of a variable gain amplifier in a mobile terminal is also provided.

40 Claims, 10 Drawing Sheets

POWER CONTROLLER FOR A MOBILE TERMINAL

BACKGROUND OF THE INVENTION

This invention relates to a mobile terminal, and, in particular to a system and method for efficiently converging the output power of a mobile terminal to a desired level.

A mobile terminal's output power may be set based on instructions received from a base station, due in large part on the distance from the mobile terminal to the base station. If the mobile terminal's output power is too low, poor uplink performance to the base station will result. If the mobile terminal's output power is too high, the mobile terminal's power source could be prematurely drained.

BRIEF SUMMARY OF THE INVENTION

A power controller for a mobile terminal variable gain amplifier (VGA) consistent with the invention includes a feed-forward path for receiving a VGA setting and providing a VGA output. The VGA setting includes an initial VGA setting adjusted by an error signal. The power controller further includes a feedback path providing the error signal. A control algorithm in the feedback path is configured to establish the error signal in response a difference between a signal representative of the VGA output and a signal representative of a target output. The error signal causes convergence of the VGA output based on a magnitude of the difference. A mobile terminal including the power controller may receive data indicating the target output from a base station.

A method of controlling the output of a variable gain amplifier in a mobile terminal consistent with the invention includes identifying an output power level from the variable amplifier; comparing the output power level with a target level; and adjusting the output power level based on a magnitude of the difference between the output power level and the target level.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Figure 1:
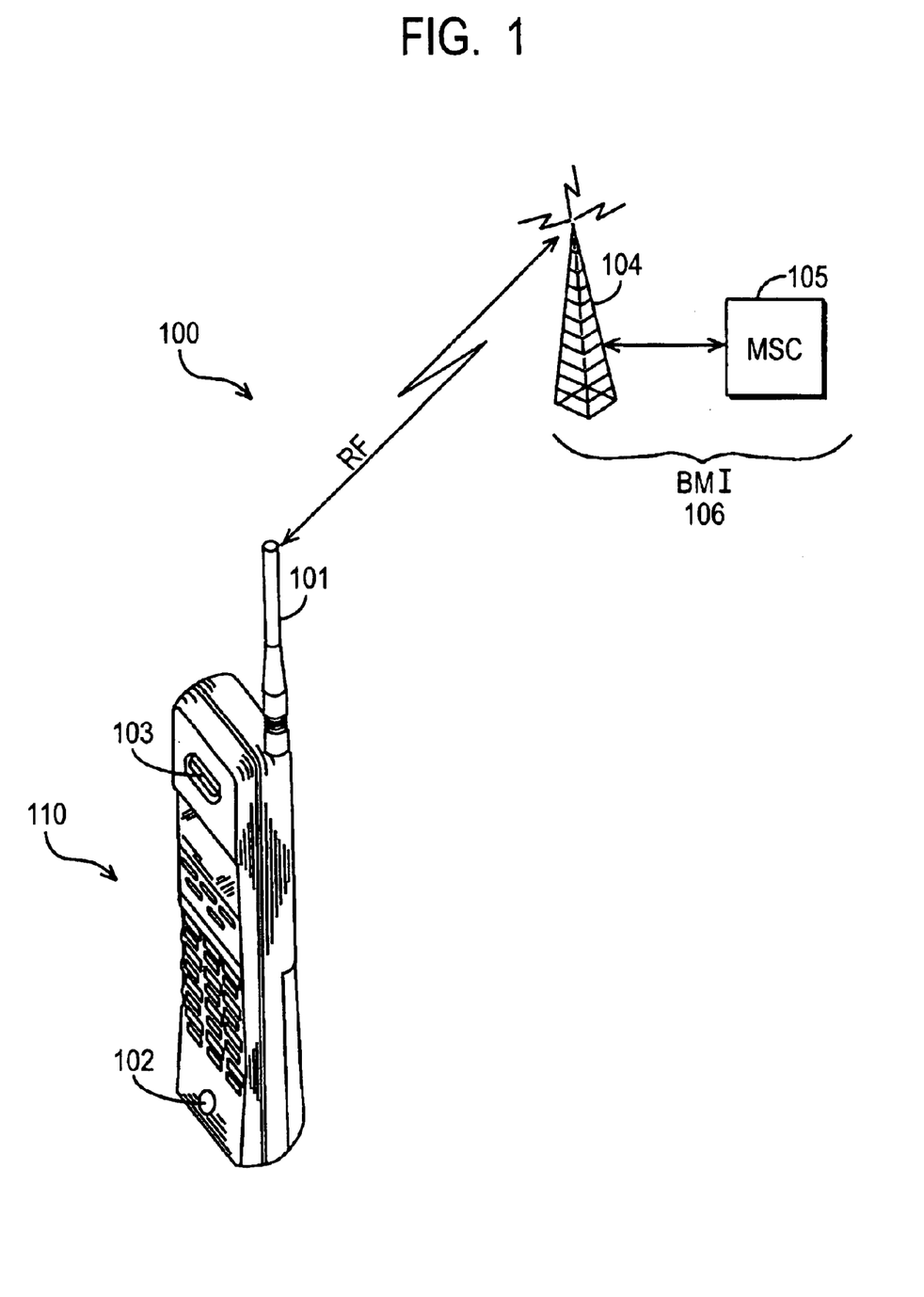
FIG. 1 is a block diagram of an exemplary communication system consistent with the present invention.

With reference to FIG. 1, there is illustrated an exemplary communication system 100 for employing a power controller in a mobile terminal consistent with the present invention. For ease of explanation, the mobile terminal 110 is graphically represented as a cellular radiotelephone. It is to be understood, however, that the term "mobile terminal" as used herein, may include a cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a positioning receiver, such as a GPS receiver; and a conventional laptop and/or palmtop receiver or other appliance that includes a radiotelephone transceiver.

In addition, the present invention is described herein in the context of a TDMA cellular network. While the present invention may be particularly useful for improving the performance of TDMA cellular networks, it should be understood that the principles of the present invention may be applied to any cellular or wireless system utilizing other air interfaces, such as GSM, CDMA or FDMA. It should be further understood that the principles of the present invention may be utilized in hybrid systems that are combinations of two or more of the above air interfaces. In addition, a mobile terminal, in accordance with the present invention, may be designed to communicate with a base station transceiver using any standard based on TDMA, GSM, CDMA, FDMA, a hybrid of such standards, or any other standard.

As shown, an exemplary system 100 consistent with the invention includes a mobile terminal 110. The mobile terminal may include an antenna 101 for transmitting signals to and receiving signals from a base station 104. The mobile terminal may also include a microphone 102 for accepting audio signals from a user, and a speaker 103 for producing audio signals received by the mobile terminal.

The mobile terminal 110 may communicate with a base station 104 through radio signals transmitted and received between the mobile terminal's antenna 101 and the base station 104. The base station may communicate with a mobile switching center (MSC) that provides connection to landline trunks when the mobile terminal 110 is involved in a call. The base station 104 and mobile switching center 105 may be components of a cellular network comprising a base station/mobile switching center/internetworking function or BMI 106. An example of such a network is a cellular telephone network, including commercially operational networks based on well-known industry standards such as TDMA, GSM, or CDMA.

In operation, the field strength received at the base station 104 from a mobile terminal transmitting a radio wave may vary as the mobile terminal moves relative to the base station 104. Accordingly, the mobile terminal's transmission power level may be controlled based in part on an instruction received from the base station. If the mobile terminal is near the base station, the mobile terminal's transmission power may be lowered to avoid cross modulation problems and unnecessary draining of the mobile terminal's battery. If the mobile terminal is far from the base station, the mobile terminal's transmission power may be increased to increase the field strength received by the base station to maintain a stable reception state. Further, the mobile terminal's transmission power may be periodically monitored to ensure that a proper transmission power level control signal is received from the base station.

Figure 2:
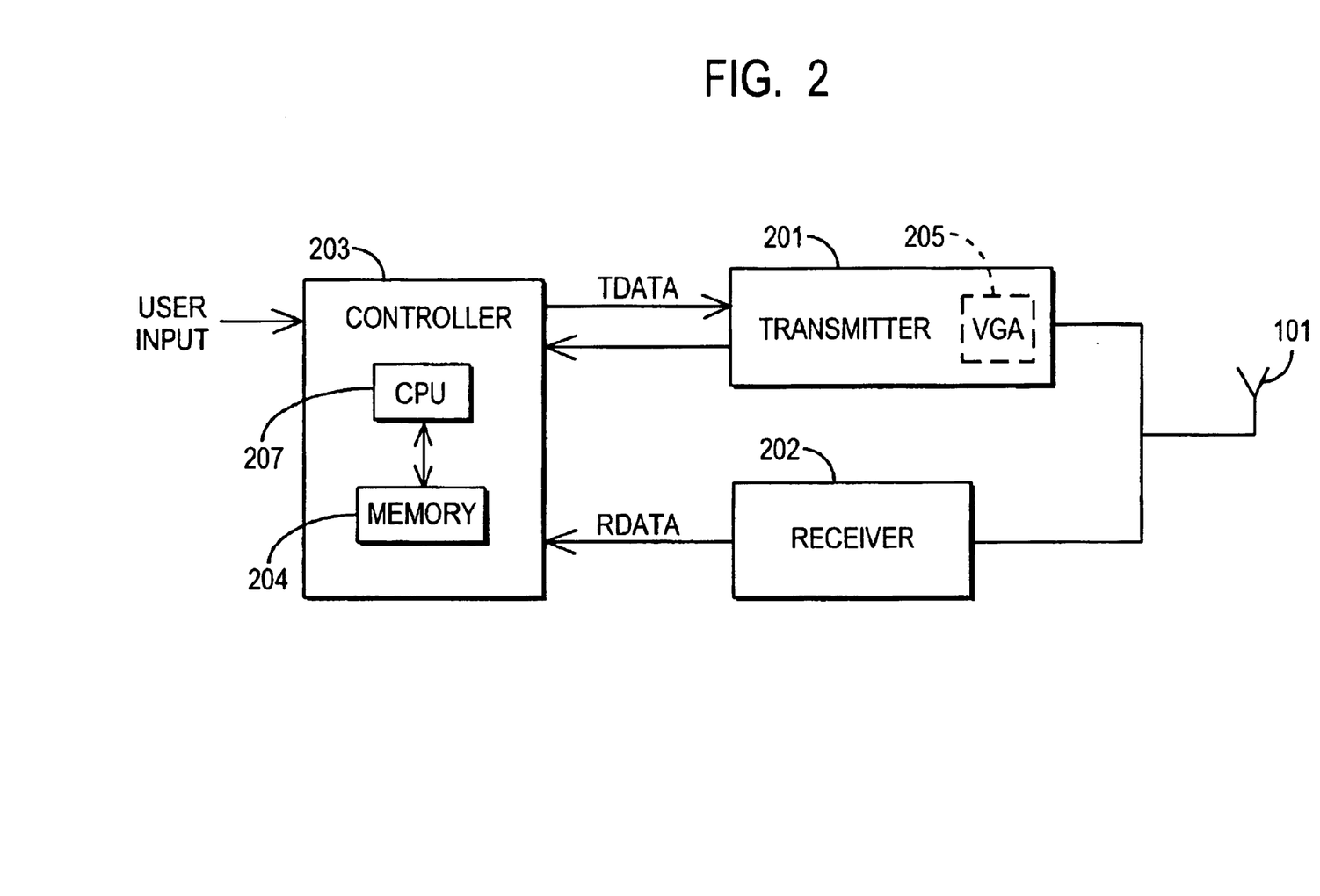
FIG. 2 is a block diagram of an exemplary mobile terminal consistent with the present invention.

Turning to FIG. 2 there is shown a block diagram of an exemplary mobile terminal consistent with the present invention. For simplicity and ease of explanation, a high-level block diagram is shown. Those skilled in the art will recognize, however, that other functional elements may be included in the mobile terminal consistent with the invention. The illustrated mobile terminal generally comprises a transmitter 201, a receiver 202, a controller 203, and an antenna 101. The transmitter further includes a variable gain amplifier (VGA) 205 and the controller further includes a central processing unit (CPU) 207 and memory 204.

The transmitter 201 may process, filter, modulate, and amplify information-bearing signals to be sent to the base station via the mobile terminal's antenna 101. For example, such information-bearing signals could be voice or data signals input by a user or data signals sent by the mobile terminal. The receiver 202 may receive information-bearing signals from the base station via the antenna 101 and filter, demodulate, and process some signals. The received data signal RDATA may contain instructions from the base station 104, based on measured electrical field strength, indicating proper transmission or target power for the mobile terminal. Those skilled in the art will recognize that a variety of transmitter and receiver types may be incorporated into an embodiment consistent with the present invention. For example, the receiver may utilize a well-known superheterodyne or homodyne architecture. The controller 203, among other things, processes the received data signal RDATA instructions to set, monitor, and adjust the VGA setting to achieve the desired output power level via a power control process consistent with the invention. Those skilled in the art will recognize that the controller may perform this function under the control of software executable by the CPU.

The VGA 205 may be controlled to amplify an output signal from the transmitter by a plurality of amplification factors depending on instructions from the controller 203. In a typical configuration, the VGA may comprise of a variable gain circuit and a power amplification circuit. The power amplification circuit may contain a variety of amplifiers that can be connected in configured in various ways by the variable gain circuit to achieve a plurality of amplification factors. Various commercially available integrated circuits or chips can be utilized to carry out the VGA functionality. Some chips tend to have discontinuities in their power input/output relationship as described more fully in reference to FIG. 4. Other chips tend to have less or no discontinuities. Various manufacturers of such chips are known to those skilled in the art.

Figure 3:
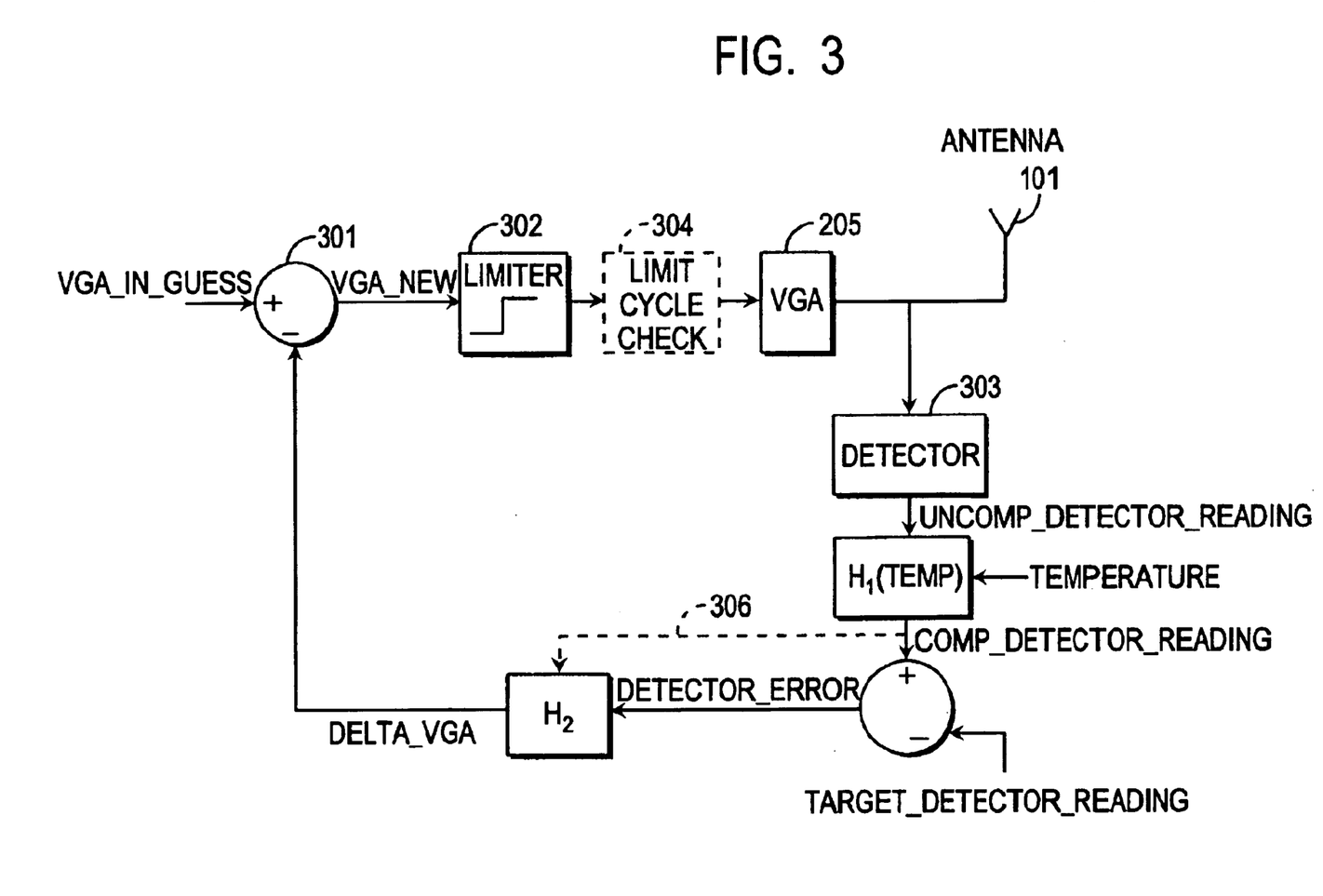
FIG. 3 is a block diagram of an exemplary power controller consistent with the invention.

FIG. 3 is a block diagram of an exemplary power controller consistent with the invention. An initial setting, e.g., "VGA_in_guess", is determined based in part on instructions from the received data signals regarding the desired output power level. The controller 203 accesses its memory 204 to read pre-loaded data that maps desired output power levels to various VGA settings. The controller 203 may utilize the CPU 207 to access such pre-loaded data in its memory 204. The data may be stored in various tables. One such table is a calibration table, which may be developed during factory testing and relates to particulars of the mobile terminal including the VGA/CPU configuration. The calibration table's dependent variables may include mode (e.g., 800 analog, 800 digital, or personal communication services (PCS)) and power level, among others.

The initial setting, VGA_in_guess, is coupled to a subtraction circuit 301, which subtracts an error signal, e.g., "Delta_VGA", initially set to zero, in an attempt to minimize the error in setting the output power. The resultant signal is coupled to a limiter 302 to ensure that the VGA setting is within the tolerance level of the VGA 205 hardware. An optional limit cycle check 304 may be used to prevent any slight oscillation above and below a target output level or Target_detector_reading. Further details on the operation of an exemplary limit cycle check 304 are provided below with reference to FIGS. 10A and 10B. A detection circuit 303 may provide an initial detector reading or Uncomp_detector_reading, which is representative of the output power level. Those skilled in the art will recognize that the detection circuit 303 can be located anywhere in the transmit chain, e.g., at the output of the VGA. Such detection circuits are well known to those skilled in the art and may include, for example, a diode-based circuit. Because the detector characteristics typically vary with temperature, a temperature-mapping function H1 may be used to map the detector reading to a final adjusted reading, e.g. "comp_detector_reading" based on the current ambient temperature T.

To take into account different temperatures and even frequency, offset tables stored in the controller's memory 204 may be used. These offset tables may compensate the initial setting, VGA_in_Guess, for temperature and frequency differences between the current conditions and the calibrated conditions. The dependent variables for the offset calculation could be temperature and frequency stored in memory for various temperature and frequency bands.

A target reading, e.g., "Target_detector_reading", e.g. determined during factory calibration or received from a base station during operation, may be identified as the desired output level. The error between the desired output and actual output power level "Detector_reading" is referred as the "Detector_error." This Detector_error is coupled to a power control algorithm H2 to estimate an error signal, e.g., "Delta_VGA". The rate of convergence of the actual output power level of the VGA to the desired or target output power level (e.g. Target_detector_reading) depends on the magnitude of the difference between the detector reading and the target reading, and is controlled by operation of the power control algorithm H2. The control algorithm may be based in part on the derivative of a detection curve. The source and modification of these detection curves is based on the output power of the VGA as a function of various VGA settings, as will be described in detail below. Depending on the embodiment, the control algorithm H2 may directly use the comp_detector_reading as indicated by the dotted line 306.

Figure 4:
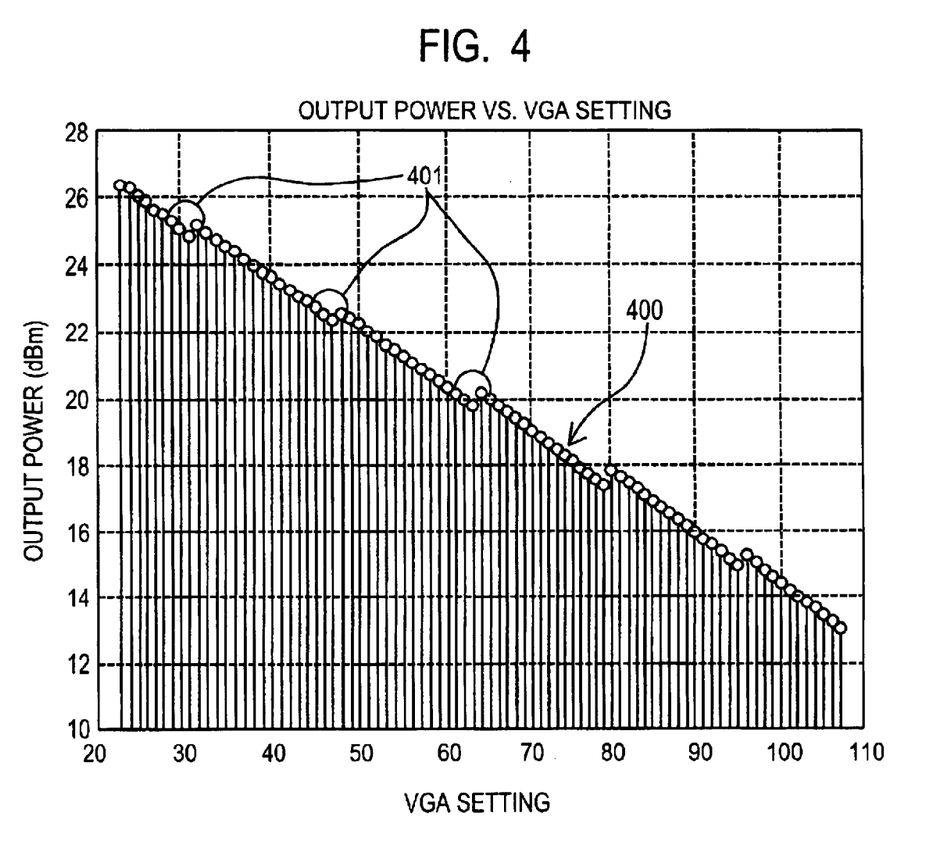
FIG. 4 is a graph of VGA settings versus output power showing discontinuities as measured by a factory instrument at ambient temperature.
Figure 5:
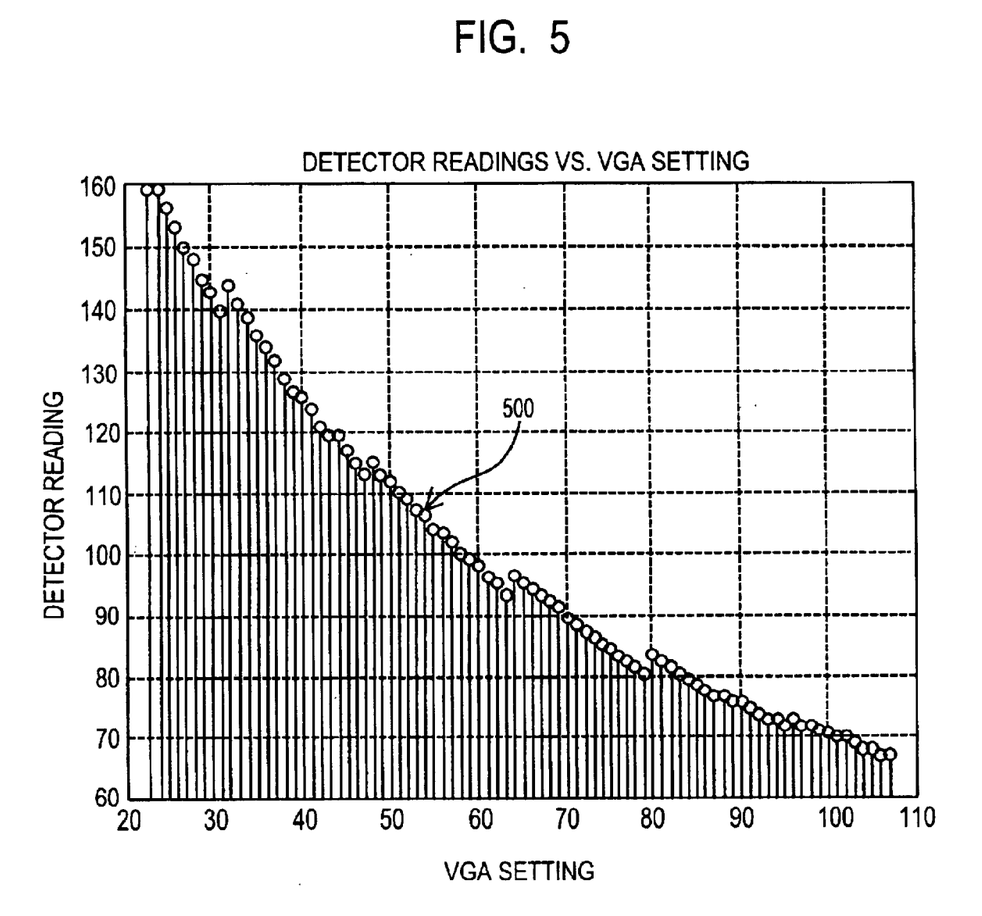
FIG. 5 is a graph of VGA settings versus output power at a non-ambient temperature as measured by the mobile terminal's power detection circuit.

Turning to FIG. 4, a sample power detection curve 400 is shown. The output power (dBm) is plotted as a function of various VGA settings as measured by a factory instrument. As shown, the curve 400 is relatively linear with a negative slope. The discontinuities 401 for various VGA settings are also shown. These discontinuities can occur with various commercially available VGA chips. Because one embodiment of the power control algorithm consistent with the invention is based in part on the derivative of similar detection curves, it is advantageous to remove these discontinuities. In addition to discontinuities, temperature changes can affect the power detection measurement circuits in the mobile terminal. A plot 500 of actual output power as measured by a mobile terminal's power detection circuit 303 is shown in FIG. 5 for the same VGA chip shown in FIG. 4 at a different temperature. Therefore, temperature changes can add error to the VGA setting process and should be properly incorporated into the process as shown in FIG. 3.

Figure 6:
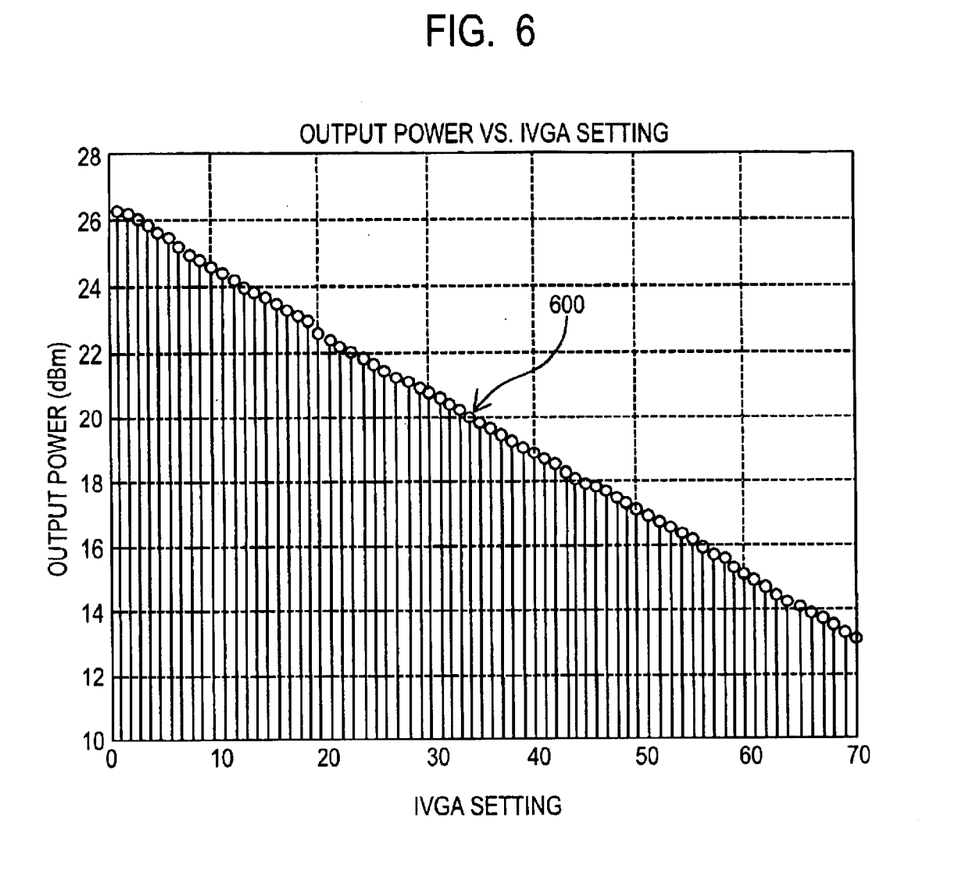
FIG. 6 is a graph of imaginary VGA settings versus output power with substantially no discontinuities as measured by a factory instrument at ambient temperature.
Figure 7:
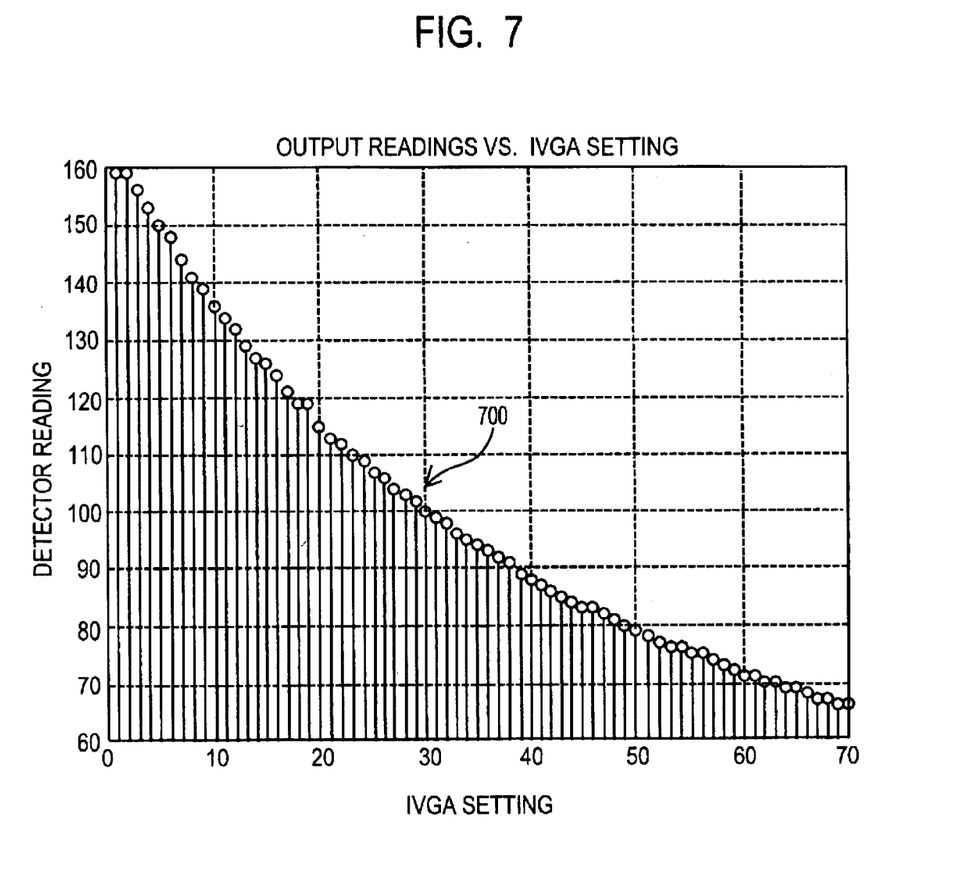
FIG. 7 is a graph of imaginary VGA settings versus output power with substantially no discontinuities at a non-ambient temperature as measured by the mobile terminal's power detection circuit.

Turning to FIGS. 6 and 7 the discontinuities shown earlier in FIGS. 4 and 5 have been removed. Again, some VGA chips have such discontinuities. Other VGA chips do not have substantial discontinuities, and therefore no special measures need to be undertaken to remove them. For certain chips, the discontinuities are virtually eliminated by not using selected VGA settings. For example, the input VGA setting an exemplary chip is a digital number between 0 and 255 that can be represented by two hexadecimal numbers. Since the discontinuities occur the last four of every 16 VGA settings, the VGA settings ending in the hexadecimal values of D, E, and F can be ignored. With this modification, FIG. 6 illustrates a plot 600 of Imaginary Variable Gain Amplifier (IVGA) Settings versus the output power in dBm for measured output power by a factory instrument. Compared to FIG. 4, the discontinuities have been virtually eliminated. Similarly, FIG. 7 illustrates a plot 700 of IVGA versus output power for measured output power by the mobile terminal at a different temperature.

The power control algorithm H2 is based in part on the derivative of the modified detection curve shown in FIG. 7. In one exemplary embodiment, the following equation may be used to calculate the derivative.

$$\frac{dIVGA}{dDetReading}[i] \approx \frac{sf1 \times offset}{DetReading[i+offset] - DetReading[i]} \quad (1)$$

where:
- i=IVGA index in the range 1 . . . npts_offset;
- npts=number of IVGA settings;
- offset=40 nominally;=difference in IVGA settings to get an accurate estimate of the slope;
- DetReading[i]=detector reading for IVGA [i]; and
- sf1=scale-factor (integer power of 2) to make quotient>>1 for fixed-point implementation convenience.

Simple linear extrapolation may be used to complete the derivative table for indices in the range (npts-offset+1) . . . npts.

Interpolation or extrapolation should also be used in cases where the denominator of equation 1 equals zero. This can possibly happen in the tail of a negative exponential function. The derivatives and the IVGA to VGA mapping table (if needed because using a VGA chip with discontinuities) are calculated after factory calibration has been performed. The algorithms to determine the "best" mapping table and derivative scale-factor are to be determined and may change for each VGA/CPU combination.

Also, all of the derivatives in equation 1 should have the same sign (a negative sign assuming a negative exponential detection function as in FIG. 7). If there are estimates that have the wrong sign (a positive sign in this case), the derivatives on each side of it (assuming they exist) can be averaged and written over the bad estimate.

The offset parameter controls how much the derivative is averaged. For smaller offset values, the derivative is comparable to a tangent to the detection curve (i.e., an "instantaneous" derivative). For larger offset values, the derivative term is an "average" slope. For large VGA input errors, an instantaneous derivative is not desired. In such a case, the issue is how much the derivatives should be averaged. For the exemplary embodiment shown in FIG. 7, the offset could be nominally set to 40. This offset value does not necessarily apply to different detection curves. Making the offset too large may cause errors in the derivative estimate for small VGA errors. Making the offset too small may cause errors in the derivative estimate for large VGA errors. Therefore, an optimal offset may best be found by trial and error.

The derivative in equation 1 is valid at the conditions present during its calculation. These are typically room temperature and mid-band transmit frequency conditions present during calibration. Changes in temperature can shift the detection curve of FIG. 7 up or down due to changes in the mobile terminal's detection circuit. Changes in frequency are typically negligible on the detection circuit. Therefore, the detector reading may be adjusted due to changes in temperature. The compensated detector value simulates what the detector reading would be at room temperature.

$$det_{comp\_curr} = det_{uncomp\_curr} - temp\_comp \quad (2)$$

where:
- $det_{comp\_curr}$=room temperature detector reading;
- $det_{uncomp\_curr}$=current raw detector reading (current temp.); and
- temp_comp=detector temperature compensation determined by engineering analysis.

The following equations may be used to calculate how much the VGA input setting must be changed to achieved a target detector value:

$$det_{err} = \frac{det_{comp\_curr} - det_{tgt}}{sf2} \quad (3)$$

where:
- $det_{err}$=detection error;
- $det_{tgt}$=target detector reading (for current temp.) determined by engineering analysis;
- sf2=scale-factor (integer power of 2)>1 to stop overflow. In an exemplary embodiment set to 1, and ideally do not use a number larger than 2.

Note that room temperature readings could be used in equation 3 while achieving the same result because both detector readings on the right hand side of the equation would have been adjusted by the same amount.

$$IVGA_{comp\_curr} = table\_lookup(det_{comp\_curr}) \quad (4)$$

where:
- $IVGA_{comp\_curr}$=current IVGA setting (room temperature)

The table lookup function used here may be determined as part of the factory calibration process. After the data shown in FIG. 7 is captured, the axes are reversed so that the IVGA room temperature setting can be accessed by the room-temperature detector reading.

$$temp\_del\_IVGA = det_{err} * \frac{dIVGA}{dDetReading}[indx] \quad (5)$$

where:
- indx=$IVGA_{comp\_curr}$ if $det_{err}<0$,

=min(IVGA$_{comp\_curr}$–offset, min_indx) if det$_{err}$≧0; and min_indx=0 or 1 depending on the programming language $$IVGA = temp\_del\_IVGA * sf2\_ov\_sf1 * lrate \qquad (6)$$

where:

IVGA=Estimated error for IVGA input setting;

$$sf\_ov\_sf1 = \frac{sf2}{sf1} = \text{integer power of 2 (i.e., } 2^{-2}, 2^{-1}, 2^0 \text{ or } 2^1\text{) constant;}$$

and lrate=learning rate=constant>0 and ≦1 and also an integer power of 2

$$IVGA_{new} = IVGA_{in\_guess} - IVGA \qquad (7)$$

where:

IVGA$_{new}$=new IVGA setting (current temp.);

IVGA$_{in\_guess}$=initial guess for IVGA setting; and

IVGA$_{uncomp\_curr}$=current uncompensated IVGA setting (current temp.).

After the new IVGA setting has been calculated, additional logic may be used to ensure it is within the allowable range of IVGA settings.

$$\text{if } IVGA_{new} > \max(IVGA) \qquad (8)$$

then $$IVGA_{new} = \max(IVGA)$$

Elseif $IVGA_{new} < \min(IVGA)$ then $$IVGA_{new} = \min(IVGA) \qquad (8)$$

where:

min(IVGA)=0 or 1 depending on the programming language.

Figure 10A:
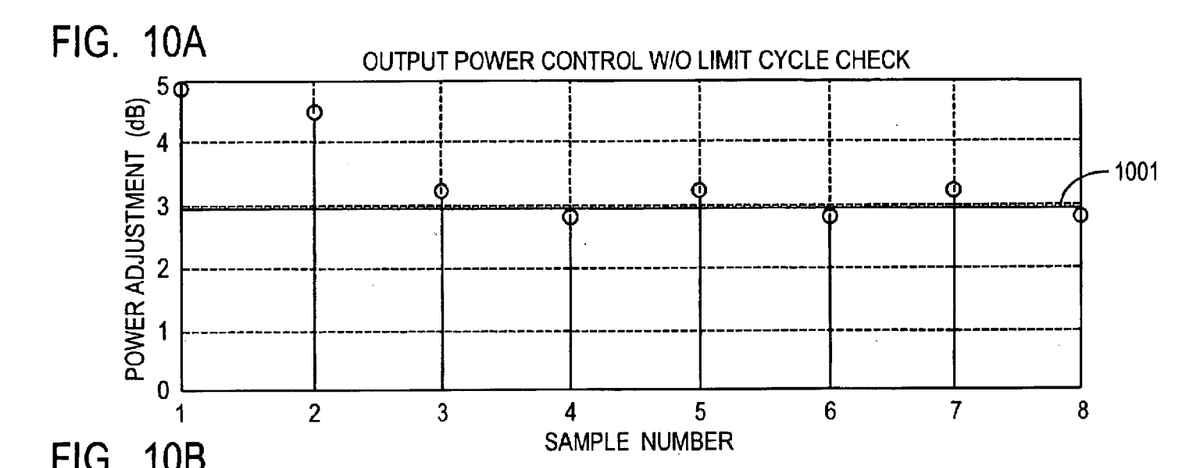
FIG. 10A is a plot of sample numbers versus power adjustments illustrating an oscillation in the power adjustments that may occur without a limit cycle check.
Figure 10B:
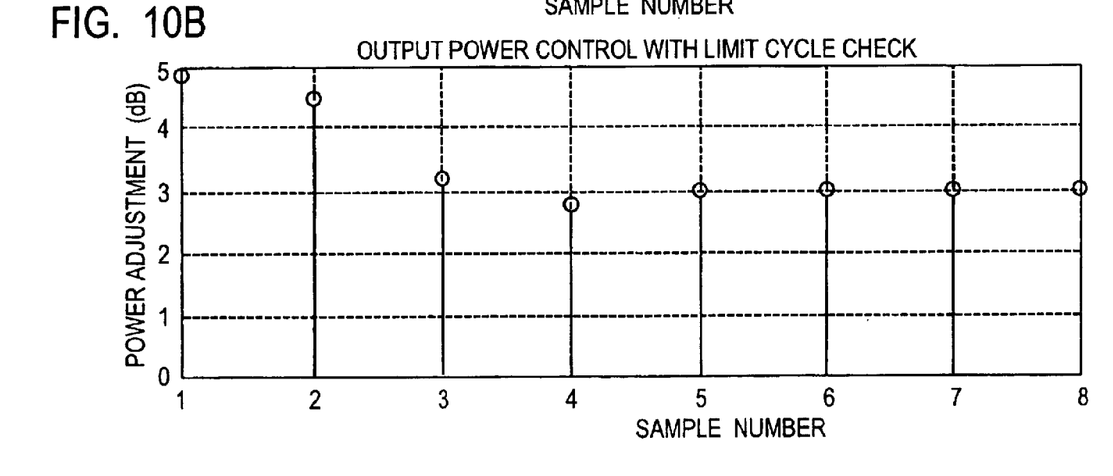
FIG. 10B is a plot of sample numbers versus power adjustments illustrating output power control with a limit cycle check.

Additional logic for a limit cycle check may also be used as shown in Equations (9) through (12). This logic senses if the detected power output is oscillating slightly above and below a target output power level adjustment as shown in FIG. 10A. FIG. 10A shows a target output power level adjustment of 3 dB as a horizontal line 1001, while the actual power adjustments are slightly above and below this level during sampling times 5, 6, 7, and 8. FIG. 10 B shows the results of applying a limit cycle check that senses the condition shown in FIG. 10A and corrects it by settling in on the average between the two values above and below the target value. FIG. 10B shows the power adjustment leveling at approximately 3 db, i.e., the target output power level, after the fifth sample number.

$$\text{if } (IVGA_{new} \text{ is not}=IVGA_{m1} \text{ and } IVGA_{new}=IVGA_{m2}) \qquad (9)$$

then $$IVGA_{new} = \text{floor}((IVGA_{new}+IVGA_{m1})/2) \qquad (9)$$

where:

IVGA$_{m1}$=previous IVGA setting=–1 (or another sentinel number) initially; and IVGA$_{m2}$=previous IVGA$_{m1}$=–1 (or another sentinel number) initially.

The last two IVGA settings need to be updated prior to the next power control update.

$$IVGA_{m1} = IVGA_{new} \qquad (10)$$

$$IVGA_{m2} = IVGA_{m1} \qquad (11)$$

Finally, the IVGA setting may be converted to a VGA setting to control the VGA.

$$VGA_{new} = \text{table\_lookup}(IVGA_{new}) \qquad (12)$$

VGA input settings that should not be used for some reason (accidentally causing downstream PA compression, etc.) should not be referenced by an IVGA setting. In other words, only "valid" VGA settings should be used in the IVGA to VGA mapping table.

For some VGA chips, increasing the VGA voltage increases the power output. In this instance, the slope of the output power versus IVGA setting as shown in FIG. 6 would be positive instead of negative. Therefore, the power detection curve shown in FIG. 7 would look like a positive exponential function rather than a negative exponential function. The signs used in equation 1 would have to be reversed for such a chip. The equality used to calculate "indx" in equation 5 would also have to be reversed for such a chip.

The power control algorithm H2 may be run on the CPU in the mobile terminal. Most CPUs in mobile terminals utilize fixed-point implementation. The following areas were incorporated into the power control algorithm to make it more "fixed-point friendly." Those skilled in the art will recognize that these areas may be modified depending on the configuration of the CPU.

The numerator in equation 1 was multiplied by a scale-factor to make the quotient much greater than one. This multiplication can be efficiently implemented using a bit shift operation if the scale-factor is constrained to be an integer power of two. The exact number used in any implementation will depend upon the specific VGA/CPU pair used in the mobile terminal.

The product in equation 5 may need to have more bits allocated to it than the two multiplicands (i.e., a "long" multiplication may be needed). However, the result of equation 6 should be able to be stored in a normal integer type.

The detector error estimate (equation 3) is divided by a scale-factor so the resultant multiplication in equation 5 does not overflow. This scale-factor may be set to one. It is anticipated that the maximum value for this factor will be two if necessary. It should not be made too large or significant digits in the error estimate will be lost. If it is set to a number greater than one, the final steady-state detector reading may never reach the target detector reading exactly.

The multiplication in equation 6 can be implemented using a bit shift operation since sf2_ov_sf1 and irate are defined to be integer powers of two.

A second exemplary embodiment of the power control algorithm is defined below. Some of the variables used were previously defined.

$$det_{comp\_tgt} = det_{tgt} - temp\_comp \qquad (13)$$

where:

det$_{comp\_tgt}$=room temperature target detector reading $$IVGA_{comp\_tgt} = \text{table\_lookup}(det_{comp\_tgt}) \qquad (14)$$

where:

$IVGA_{comp\_tgt}$=IVGA setting corresponding to room temperature target detector reading $$IVGA = IVGA_{comp\_curr} - IVGA_{comp\_tgt} \qquad (15)$$

The rest of the algorithm is the same as the first embodiment of the algorithm. Equations 7 through 12 may be used to calculate $VGA_{new}$.

The first exemplary embodiment of the algorithm uses knowledge of the derivative of the detection curve to calculate how much of an adjustment is needed to the VGA input. The equations utilized are similar to a single perceptron having a negative exponential activation function. The equivalent perceptron "learns" using a modified form of the traditional delta rule.

The power control algorithm enables variable adjustments to be made to the VGA setting. In general, the larger the detector error, the more the algorithm corrects. The smaller the detector error, the less the algorithm corrects. In addition, the update rate of the power control loop can be dynamically changed. In general, a small detector error will result in an increased time until the next update, while any condition that causes the error to increase to a large detector error would cause the control algorithm to resume more frequent adjustments.

Figure 8:
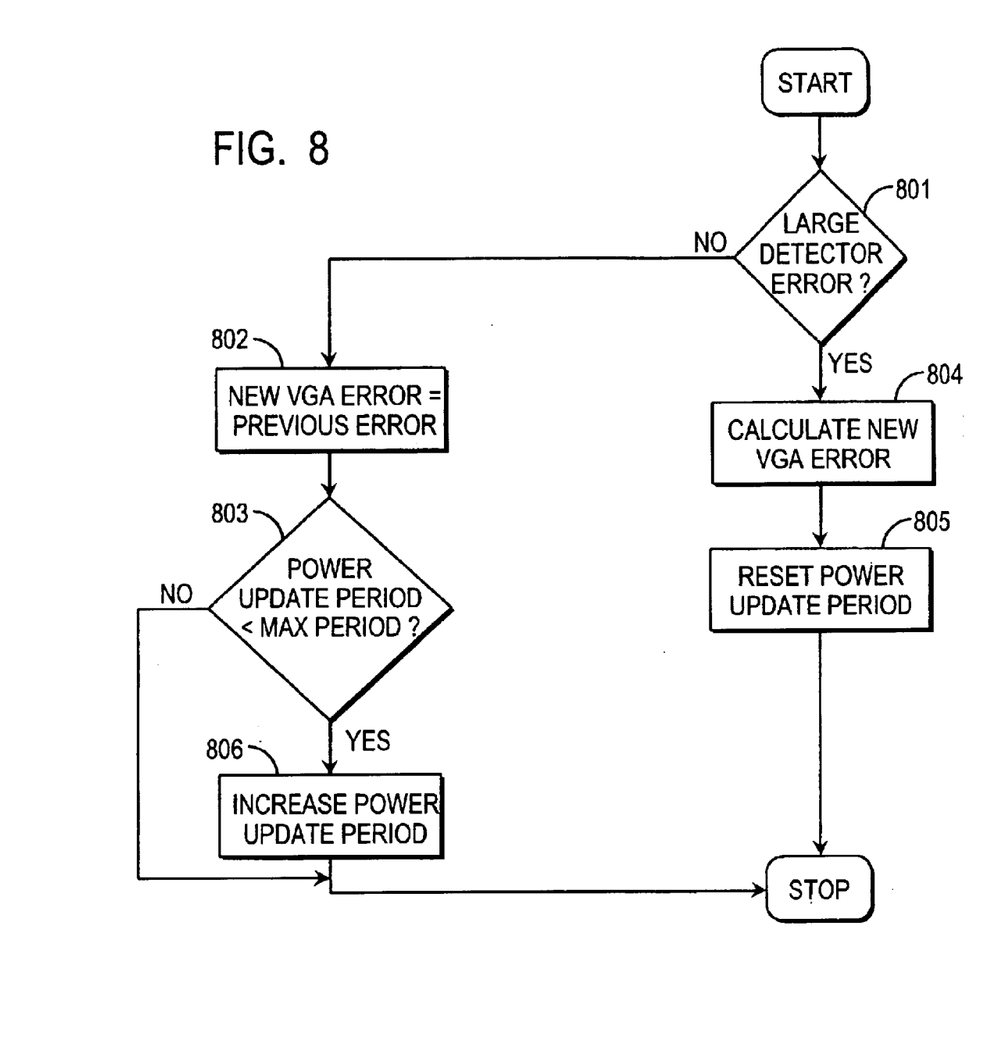
FIG. 8 is a flowchart illustrating operation of exemplary power control system consistent with the present invention.

Turning now to FIG. 8, there is shown a flow chart 800 for an exemplary control algorithm H2 consistent with the present invention. Again, the control algorithm may be implemented as software executable by the CPU. As shown, a determination is made as to whether there is a small or large detector error 801. If a small detector error is present, the control algorithm will insert a new detector error equal to the previous error 802. It will then determine if the power update period is currently less than the maximum period 803. If it is not, it will stop there until the next large detector error is detected. If it is less than the maximum period, then the power update period will be increased 806. If a large detector error is present, the software control algorithm will calculate a new VGA error 804 and then reset the power update period 805 based on that new error. In general, the larger the error the more frequently the power update period will be. It should be noted that the sampling time may be constant, and that the actuating time or the times that the power updates are performed may be changed.

Figure 9:
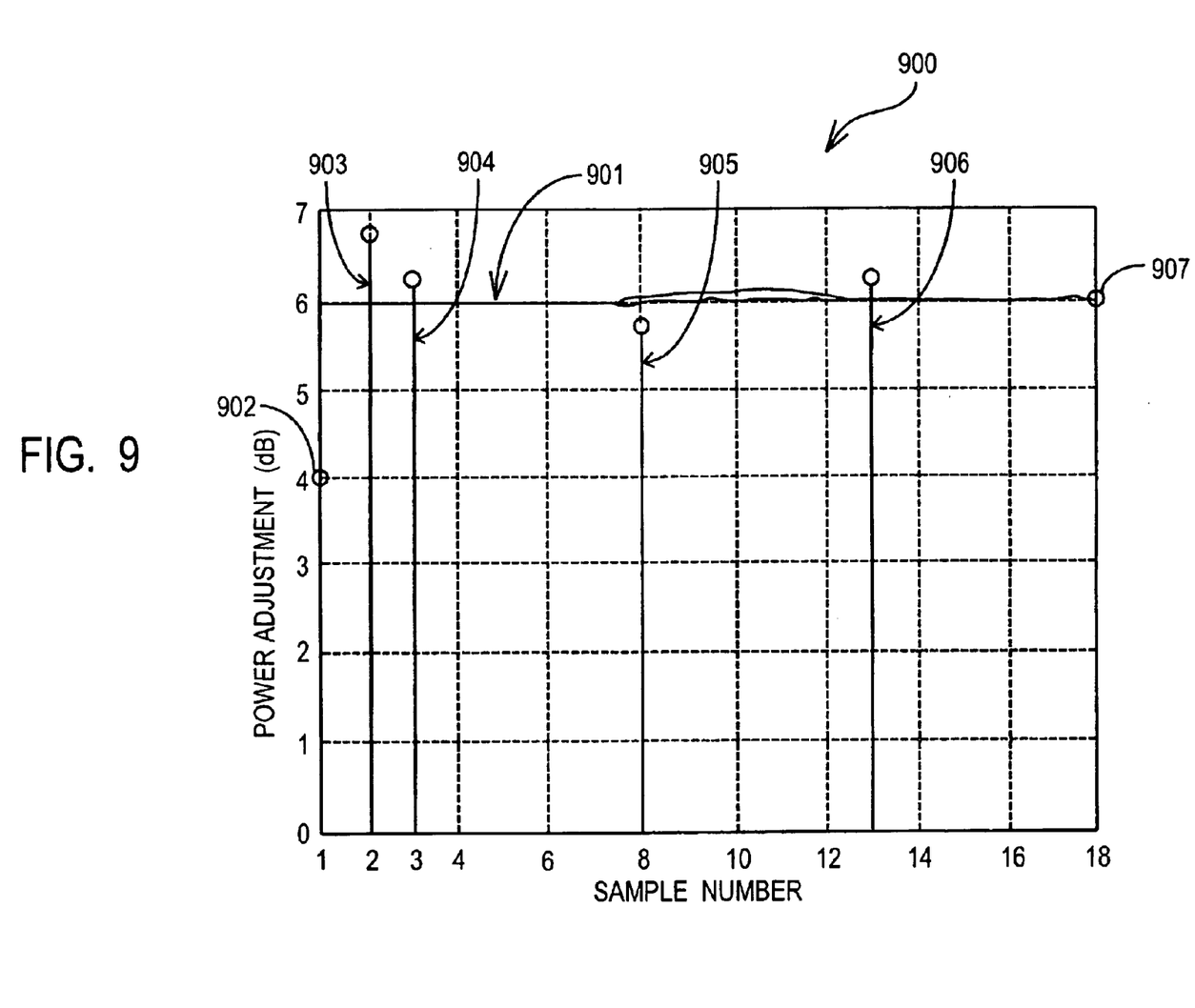
FIG. 9 is a plot of sample numbers versus power adjustments illustrating operation of an exemplary power controller consistent with the invention.

Turning to FIG. 9, the exemplary results of employing a power control algorithm consistent with the present invention are illustrated in a plot 900 of sample numbers versus power adjustments. The sample numbers on the x-axis sample are shown at constant intervals and a mobile terminal consistent with this invention continues to sample at such constant intervals. For example, if a typical power controller had an update rate of every 20 ms, then sample number 10 would correspond to 200 ms.

The y-axis shows the desired output power level adjustment 901 as a solid horizontal line of 6 dB. The actual power adjustments made are shown as vertical stems 902 through 907. Initial adjustments 902, 903, and 904 are made during sample numbers 1, 2, and 3, respectively, because the VGA error is larger. Typically, more adjustments will be made initially since it is more probable there is a larger VGA error at this time.

During sample numbers or times 4, 5, 6, and 7 no updates are performed since the last VGA error was not a large error. Samples are still taken at these times, however no power updates are performed because the last VGA error was not large. The next sample 905 occurs at sample number 8 and the last sample adjustment 907 made at sample number 18 converges the VGA setting to the desired power adjustment 901 of 6 dB. Any condition such as a large temperature change that would cause a large detector error would cause the software control algorithm to resume more frequent power adjustments.

Because the power control algorithm can make larger adjustments, the initial setting, VGA_in_guess, does not have to be as accurate as typically required in closed loop power controllers. This therefore requires less data to be stored in memory. In addition, because fewer adjustments are made once the VGA error is not large, there is less computational burden placed on the CPU of the mobile terminal. Also, the software control algorithm is adjusted until the detector error is zero within the limits of the fixed-point arithmetic typically employed by the mobile terminal's CPU. In contrast, other methods only converge to a bandwidth around the desired steady state output.

Those skilled in the art will recognize that the present invention may be embodied as cellular communication systems, methods, and/or computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). It is noted that the computer-usable or computer-readable memory could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

The embodiments that have been described herein, however, are but some of the several which utilize this invention and are set forth here by way of illustration but not of limitation. It is obvious that many other embodiments, which will be readily apparent to those skilled in the art, may be made without departing materially from the spirit and scope of the invention.

What is claimed is:

1. A power controller for a mobile terminal variable gain amplifier (VGA) comprising:
    a feed-forward path for receiving a VGA setting and providing a VGA output, said VGA setting comprising an initial VGA setting adjusted by an error signal; and
    a feedback path for providing said error signal, said feedback path comprising a control algorithm configured to establish said error signal in response to a difference between a signal representative of said VGA output and a signal representative of a target output, said error signal causing convergence of said VGA output towards said target output based on a magnitude of said difference.

2. A power controller according to claim 1, wherein said feed forward path further comprises a limit cycle check.

3. A power controller according to claim 1, wherein said control algorithm is configured to set said error signal equal to a previous error signal when said difference is below a predetermined level.

4. A power controller according to claim 3, wherein said control algorithm is configured to increase a time to a next adjustment of said error signal when said difference is below said predetermined level.

5. A power controller according to claim 3, wherein said control algorithm is configured to increase a time to a next adjustment of said error signal when said difference is below said predetermined level and a time to a next adjustment is less than a maximum update period length.

6. A power controller according to claim 1, wherein said control algorithm is configured to set said error signal based on a predetermined plot representative of VGA output versus said VGA setting.

7. A power controller according to claim 6, wherein said plot is represented by data stored in a computer-readable memory.

8. A power controller according to claim 6, wherein said control algorithm is configured to set said error signal based on a derivative of said plot.

9. A power controller according to claim 6, wherein said plot is selected to exhibit a substantially linear relationship between said VGA output and said VGA setting.

10. A power controller according to claim 1, wherein said feedback path comprises a detector for detecting said VGA output and providing said signal representative of said VGA output.

11. A power controller according to claim 10, wherein said detector comprises a temperature control algorithm to account for temperature variations in providing said signal representative of said VGA output.

12. A mobile terminal comprising:
   a transmitter having a variable gain amplifier (VGA) controlled by a power controller, said power controller comprising:
      a feed-forward path receiving a VGA setting and providing a VGA output, said VGA setting comprising an initial VGA setting adjusted by an error signal; and
      a feedback path providing said error signal, said feedback path comprising a control algorithm configured to establish said error signal in response to a difference between a signal representative of said VGA output and a signal representative of a target output, said error signal causing convergence of said VGA output towards said target output based on a magnitude of said difference.

13. A mobile device according to claim 12, wherein said feed forward path further comprises a limit cycle check.

14. A mobile device according to claim 12, wherein said control algorithm is configured to set said error signal equal to a previous error signal when said difference is below a predetermined level.

15. A mobile terminal according to claim 14, wherein said control algorithm is configured to increase a time to a next adjustment of said error signal when said difference is below said predetermined level.

16. A mobile terminal according to claim 14, wherein said control algorithm is configured to increase a time to a next adjustment of said error signal when said difference is below said predetermined level and a time to a next adjustment is less than a maximum update period length.

17. A mobile terminal according to claim 12, wherein said control algorithm is configured to set said error signal based on a predetermined plot representative of VGA output versus said VGA setting.

18. A mobile terminal according to claim 17, wherein said plot is represented by data stored in a computer-readable memory.

19. A mobile terminal according to claim 17, wherein said control algorithm is configured to set said error signal based on a derivative of said plot.

20. A mobile terminal according to claim 17, wherein said plot is selected to exhibit a substantially linear relationship between said VGA output and said VGA setting.

21. A mobile terminal according to claim 12, wherein said feedback path comprises a detector for detecting said VGA output and providing said signal representative of said VGA output.

22. A mobile terminal according to claim 21, wherein said detector comprises a temperature control algorithm to account for temperature variations in providing said signal representative of said VGA output.

23. A method of controlling the output of a variable gain amplifier (VGA) in a mobile terminal comprising:
   generating a VGA setting on a feed-forward path, said VGA setting comprising an initial VGA setting adjusted by an error signal;
   identifying a signal representative of said VGA output;
   comparing said signal representative of said VGA output with a target output; and
   adjusting said signal representative of said VGA output based on a magnitude of the difference between said signal representative of said VGA output and said target output.

24. A method according to claim 23, said method further comprising increasing a time to a next adjustment of said signal representative of said VGA output when said difference is below a predetermined level.

25. A method according to claim 23, wherein said signal representative of said VGA output is adjusted based on a predetermined plot of a signal representative of said VGA output versus a VGA setting when said magnitude is above a predetermined level.

26. A method according to claim 25, wherein said signal representative of said VGA output is adjusted based on a derivative of said plot.

27. A method according to claim 25, wherein said plot is selected to exhibit a substantially linear relationship between said signal representative of said VGA output and said VGA setting.

28. A communication system comprising:
   at least one base station; and
   a mobile terminal configured to receive communication signals from said base station, said mobile terminal comprising a transmitter having a variable gain amplifier (VGA) controlled by a power controller, said power controller comprising
      a feed-forward path receiving a VGA setting and providing a VGA output, said VGA setting comprising an initial VGA setting adjusted by an error signal, and
      a feedback path providing said error signal, said feedback path comprising a control algorithm configured to establish said error signal in response to a difference between a signal representative of said VGA output and a target output power level, said error signal causing convergence of said VGA output toward said target output based on a magnitude of said difference.

29. A system according to claim 28, wherein said control algorithm is configured to set said error signal equal to a previous error signal when said difference is below a predetermined level.

30. A system according to claim 29, wherein said control algorithm is configured to increase a time to a next adjustment of said error signal when said difference is below said predetermined level.

31. A system according to claim 29, wherein said control algorithm is configured to increase a time to a next adjustment of said error signal when said difference is below said predetermined level and a time to a next adjustment is less than a maximum update period length.

32. A system according to claim 28, wherein said control algorithm is configured to calculate a new error signal when a previous error signal is above a predetermined level.

33. A system according to claim 32, wherein said control algorithm is configured to decrease a time to a next adjustment of said error signal when said difference is above said predetermined level.

34. A system according to claim 28, wherein said control algorithm is configured to set said error signal based on a predetermined plot representative of VGA output versus said VGA setting.

35. A system according to claim 34, wherein said plot is represented by data stored in a computer-readable memory.

36. A system according to claim 34, wherein said control algorithm is configured to set said error signal based on a derivative of said plot.

37. A system according to claim 34, wherein said plot is selected to exhibit a substantially linear relationship between said VGA output and said VGA setting.

38. A system according to claim 28, wherein said feedback path comprises a detector for detecting said VGA output and providing said signal representative of said VGA output.

39. A system according to claim 38, wherein said detector comprises a temperature control algorithm to account for temperature variations in providing said signal representative of said VGA output.

40. A system according to claim 28, wherein data representing said target output power level is transmitted from said base station to said mobile terminal.

* * * * *